US011967964B1

United States Patent
Katz et al.

(10) Patent No.: US 11,967,964 B1
(45) Date of Patent: Apr. 23, 2024

(54) CLOCK SYNCHRONIZATION IN A NETWORK USING A DISTRIBUTED PULSE SIGNAL

(71) Applicant: Amazon Technologies, Inc., Seattle, WA (US)

(72) Inventors: Noam Katz, Tel Aviv-Jaffa (IL); Said Bshara, Tira (IL); Erez Izenberg, Tel Aviv-Jaffa (IL); Noam Attias, Tel Aviv (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/709,939

(22) Filed: Mar. 31, 2022

(51) Int. Cl.
| H03L 7/10 | (2006.01) |
| G11C 7/10 | (2006.01) |
| H03L 7/083 | (2006.01) |
| H03L 7/199 | (2006.01) |

(52) U.S. Cl.
CPC ............ *H03L 7/103* (2013.01); *G11C 7/1039* (2013.01); *H03L 7/083* (2013.01); *H03L 7/199* (2013.01)

(58) Field of Classification Search
None
See application file for complete search history.

(56) References Cited

U.S. PATENT DOCUMENTS

| 9,104,345 | B2* | 8/2015 | Agrawal | G06F 5/12 |
| 9,294,999 | B2* | 3/2016 | Mueller-Weinfurtner | H04W 52/0238 |
| 9,485,080 | B1* | 11/2016 | Duan | H03K 5/135 |
| 9,496,879 | B1* | 11/2016 | Duan | H04L 7/0087 |
| 9,876,491 | B2* | 1/2018 | Neidengard | H03K 3/0315 |
| 10,571,953 | B2* | 2/2020 | Fayneh | G06F 1/06 |
| 10,841,027 | B2* | 11/2020 | Yanagisawa | H04L 7/04 |
| 2022/0311445 | A1* | 9/2022 | Sasi | G06F 13/1673 |

* cited by examiner

Primary Examiner — Thomas J. Hiltunen
Assistant Examiner — Khareem E Almo
(74) Attorney, Agent, or Firm — Klarquist Sparkman, LLP

(57) ABSTRACT

A clock disciplining scheme uses a pulse per second (PPS) signal that is distributed throughout a network to coordinate timing. In determining the time, jitter can occur due to latency between detection of the PPS signal and a software interrupt generated there from. This jitter affects the accuracy of the clock disciplining process. To eliminate the jitter, extra hardware is used to capture when the PPS signal occurred relative to a hardware clock counter associated with the clock disciplining software. In one embodiment, the extra hardware can be a sampling logic, which captures a state of a hardware clock counter upon PPS detection. In another embodiment, the extra hardware can initiate a counter that calculates a delay by the clock disciplining software in reading the hardware clock counter. The disciplining software can then subtract the calculated delay from a hardware clock counter to obtain the original PPS signal.

17 Claims, 9 Drawing Sheets

CLOCK SYNCHRONIZATION IN A NETWORK USING A DISTRIBUTED PULSE SIGNAL

BACKGROUND

Computing devices can utilize communication networks to exchange data. Companies and organizations operate computer networks that interconnect computing devices to support operations or to provide services to third parties. The computing systems can be located in a single geographic location or located in multiple, distinct geographic locations. Data centers or data processing centers, herein generally referred to as a "data center," may include a number of interconnected computing systems to provide computing resources to users of the data center.

To facilitate increased utilization of data center resources, virtualization technologies allow a single physical computing device to host one or more instances of virtual machines that operate as independent computing devices to users of the data center. With virtualization, the single physical computing device can create, maintain, delete, and manage virtual machines in a dynamic manner. In turn, users can request computer resources from the data center and be provided with virtual machine resources. These virtual machines carry out a wide variety of functionalities, such as invoking network-accessible services, conducting data processing, etc.

In some cases, multiple computing devices may be interconnected to provide desired functionality. Such devices may be referred to as "distributed," such as by implementing a distributed service or a distributed computing environment. One challenge that often occurs in distributed computing is the difficulty of creating a shared notion of time. It may be desirable to use time information to implement various policies in a computing service, such as to resolve priority of conflicting requests. However, in the distributed context, each device may have an independent notion of time, and, as such, it may be difficult to determine which conflicting requests occurred first. A variety of techniques exist to attempt to synchronize time between networked computers. For example, the Network Time Protocol (NTP) enables computing devices to communicate with a reference timekeeper over a network and receive a current time. NTP can be used to synchronize a plurality of computers in a network to a universal time clock. However, such techniques are typically not sufficiently accurate or are too complex to implement in wide-scale distributed computing platforms.

DETAILED DESCRIPTION

System clocks used to synchronize computers in a network may suffer from drift due to variance in a phase-lock loop, temperature change, etc. To reduce this drift "clock disciplining" schemes are applied. One such scheme uses a pulse per second (PPS) signal derived from an atomic clock. When clock disciplining software receives the PPS signal, it reads the current time, compares it to the expected time and changes the clock settings accordingly. The latency between detection of the PPS signal, a software interrupt generated there from and a reading of the time can cause a jitter affected by system and CPU load. This jitter affects the accuracy of the clock disciplining process. To eliminate the jitter, extra hardware is used to capture when the PPS signal occurred relative to a hardware clock counter associated with the clock disciplining software. In one embodiment, the extra hardware can be a sampling logic, which latches a state of a hardware clock counter upon detection of the PPS signal. The disciplining software can then read the latched time, which has a constant delay from the original PPS signal. In another embodiment, the extra hardware can initiate a counter that calculates a delay by the clock disciplining software in reading the hardware clock counter. The disciplining software can then subtract the calculated delay from a hardware clock counter to obtain a count when the original PPS signal occurred.

The resultant clock can be highly accurate and within 100 microseconds of UTC time, for example. The resultant highly accurate clock can be advantageous for a variety of applications. For example, the accurate clock can be used for distributed systems, such as databases, and for synchronizing between geographically distributed instances. Additionally, the clock can be used for financial transactions requiring accurate timestamping to support and audit regulatory requirements. Additionally, the clock can comply with European Union MiFID II regulations requiring accuracy within 100 microseconds. The clock further complies with recently published standards by the Advanced Media Workflow Association (AMWA) that require a PTP interface and clock accuracy within 100 microseconds of Coordinate Universal Time (UTC) time. Still further, the clock can be used for authentication and authorization protocol applications that accept connections only with correct timestamps. The clock can also be used in other applications requiring accurate timing.

Figure 1:
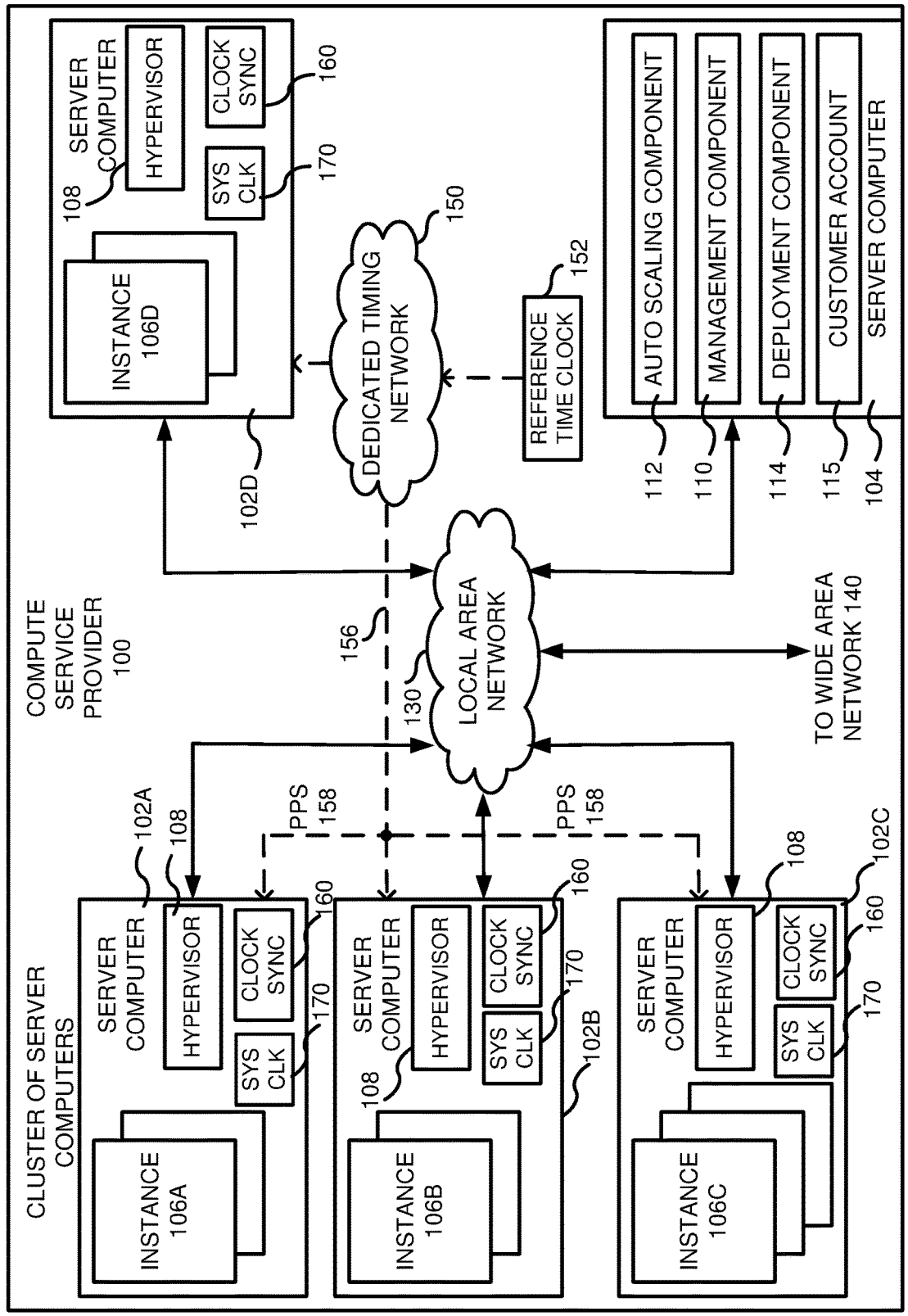
FIG. 1 is an example system diagram showing a plurality of virtual machine instances running in a multi-tenant environment with separate networks for communication and timing signals, with clock synchronization hardware located on server computers within the multi-tenant environment.

FIG. 1 is a computing system diagram of a network-based compute service provider 100 that illustrates one environment in which embodiments described herein can be used. By way of background, the compute service provider 100 (e.g., the cloud provider) is capable of delivery of computing and storage capacity as a service to a community of end recipients. In an example embodiment, the compute service provider can be established for an organization by or on behalf of the organization. That is, the compute service provider 100 may offer a "private cloud environment." In another embodiment, the compute service provider 100 supports a multi-tenant environment, wherein a plurality of users operate independently (e.g., a public cloud environment). Generally speaking, the compute service provider 100 can provide the following models: Infrastructure as a Service ("IaaS"), Platform as a Service ("PaaS"), and/or Software as a Service ("SaaS"). Other models can be provided. For the IaaS model, the compute service provider 100 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. The SaaS model allows installation and operation of application software in the compute service provider. In some embodiments, end users access the compute service provider 100 using networked client devices, such as desktop computers, laptops, tablets, smartphones, etc. running web browsers or other lightweight client applications. Those skilled in the art will recognize that the compute service provider 100 can be described as a "cloud" environment.

In some implementations of the disclosed technology, the computer service provider 100 can be a cloud provider network. A cloud provider network (sometimes referred to simply as a "cloud") refers to a pool of network-accessible computing resources (such as compute, storage, and networking resources, applications, and services), which may be virtualized or bare-metal. The cloud can provide convenient, on-demand network access to a shared pool of configurable computing resources that can be programmatically provisioned and released in response to user commands. These resources can be dynamically provisioned and reconfigured to adjust to variable load. Cloud computing can thus be considered as both the applications delivered as services over a publicly accessible network (e.g., the Internet, a cellular communication network) and the hardware and software in cloud provider data centers that provide those services.

With cloud computing, instead of buying, owning, and maintaining their own data centers and servers, organizations can acquire technology such as compute power, storage, databases, and other services on an as-needed basis. The cloud provider network can provide on-demand, scalable computing platforms to users through a network, for example allowing users to have at their disposal scalable "virtual computing devices" via their use of the compute servers and block store servers. These virtual computing devices have attributes of a personal computing device including hardware (various types of processors, local memory, random access memory ("RAM"), hard-disk and/or solid-state drive ("SSD") storage), a choice of operating systems, networking capabilities, and pre-loaded application software. Each virtual computing device may also virtualize its console input and output ("I/O") (e.g., keyboard, display, and mouse). This virtualization allows users to connect to their virtual computing device using a computer application such as a browser, application programming interface, software development kit, or the like, in order to configure and use their virtual computing device just as they would a personal computing device. Unlike personal computing devices, which possess a fixed quantity of hardware resources available to the user, the hardware associated with the virtual computing devices can be scaled up or down depending upon the resources the user requires. Users can choose to deploy their virtual computing systems to provide network-based services for their own use and/or for use by their users or clients.

A cloud provider network can be formed as a number of regions, where a region is a separate geographical area in which the cloud provider clusters data centers. Each region can include two or more availability zones connected to one another via a private high-speed network, for example a fiber communication connection. An availability zone (also known as an availability domain, or simply a "zone") refers to an isolated failure domain including one or more data center facilities with separate power, separate networking, and separate cooling from those in another availability zone. A data center refers to a physical building or enclosure that houses and provides power and cooling to servers of the cloud provider network. Preferably, availability zones within a region are positioned far enough away from one other that the same natural disaster should not take more than one availability zone offline at the same time. Users can connect to availability zones of the cloud provider network via a publicly accessible network (e.g., the Internet, a cellular communication network) by way of a transit center (TC). TCs are the primary backbone locations linking users to the cloud provider network and may be collocated at other network provider facilities (e.g., Internet service providers, telecommunications providers) and securely connected (e.g., via a VPN or direct connection) to the availability zones. Each region can operate two or more TCs for redundancy. Regions are connected to a global network which includes private networking infrastructure (e.g., fiber connections controlled by the cloud provider) connecting each region to at least one other region. The cloud provider network may deliver content from points of presence outside of, but networked with, these regions by way of edge locations and regional edge cache servers. This compartmentalization and geographic distribution of computing hardware enables the cloud provider network to provide low-latency resource access to users on a global scale with a high degree of fault tolerance and stability.

The cloud provider network may implement various computing resources or services that implement the disclosed techniques for TLS session management, which may include an elastic compute cloud service (referred to in various implementations as an elastic compute service, a virtual machines service, a computing cloud service, a compute engine, or a cloud compute service), data processing service (s) (e.g., map reduce, data flow, and/or other large scale data processing techniques), data storage services (e.g., object storage services, block-based storage services, or data warehouse storage services) and/or any other type of network based services (which may include various other types of storage, processing, analysis, communication, event handling, visualization, and security services not illustrated). The resources required to support the operations of such services (e.g., compute and storage resources) may be provisioned in an account associated with the cloud provider, in contrast to resources requested by users of the cloud provider network, which may be provisioned in user accounts.

The particular illustrated compute service provider 100 includes a plurality of server computers 102A-102D. While only four server computers are shown, any number can be used, and large centers can include thousands of server computers. The server computers 102A-102D can provide computing resources for executing software instances 106A-106D. In one embodiment, the instances 106A-106D are virtual machines. As known in the art, a virtual machine is an instance of a software implementation of a machine (i.e., a computer) that executes applications like a physical machine. In the example of virtual machine, each of the servers 102A-102D can be configured to execute a hypervisor 108 or another type of program configured to enable the execution of multiple instances 106 on a single server. Additionally, each of the instances 106 can be configured to execute one or more applications.

It should be appreciated that although the embodiments disclosed herein are described primarily in the context of virtual machines, other types of instances can be utilized with the concepts and technologies disclosed herein. For instance, the technologies disclosed herein can be utilized with storage resources, data communications resources, and with other types of computing resources. The embodiments disclosed herein might also execute all or a portion of an application directly on a computer system without utilizing virtual machine instances.

One or more server computers 104 can be reserved for executing software components for managing the operation of the server computers 102 and the instances 106. For example, the server computer 104 can execute a management component 110. A user can access the management component 110 to configure various aspects of the operation of the instances 106 purchased by the user. For example, the user can purchase, rent or lease instances and make changes to the configuration of the instances. The user can also specify settings regarding how the purchased instances are to be scaled in response to demand. The management component can further include a policy document to implement user policies. An auto scaling component 112 can scale the instances 106 based upon rules defined by the user. In one embodiment, the auto scaling component 112 allows a user to specify scale-up rules for use in determining when new instances should be instantiated and scale-down rules for use in determining when existing instances should be terminated. The auto scaling component 112 can consist of a number of subcomponents executing on different server computers 102 or other computing devices. The auto scaling component 112 can monitor available computing resources over an internal management network and modify resources available based on need.

A deployment component 114 can be used to assist users in the deployment of new instances 106 of computing resources. The deployment component can have access to account information associated with the instances, such as who is the owner of the account, credit card information, country of the owner, etc. The deployment component 114 can receive a configuration from a user that includes data describing how new instances 106 should be configured. For example, the configuration can specify one or more applications to be installed in new instances 106, provide scripts and/or other types of code to be executed for configuring new instances 106, provide cache logic specifying how an application cache should be prepared, and other types of information. The deployment component 114 can utilize the user-provided configuration and cache logic to configure, prime, and launch new instances 106. The configuration, cache logic, and other information may be specified by a user using the management component 110 or by providing this information directly to the deployment component 114. The instance manager can be considered part of the deployment component.

User account information 115 can include any desired information associated with a user of the multi-tenant environment. For example, the user account information can include a unique identifier for a user, a user address, billing information, licensing information, customization parameters for launching instances, scheduling information, auto-scaling parameters, previous IP addresses used to access the account, etc.

A network 130 can be utilized to interconnect the server computers 102A-102D and the server computer 104 for transmission of packet data therebetween. The network 130 can be a local area network (LAN) and can be connected to a Wide Area Network (WAN) 140 so that end users can access the compute service provider 100. It should be appreciated that the network topology illustrated in FIG. 1 has been simplified and that many more networks and networking devices can be utilized to interconnect the various computing systems disclosed herein.

A second network 150 can be independent of the local area network 130 and use separate cabling for interconnecting the server computers 102A-102D. More specifically, the second network 150 can be a dedicated timing network that receives a reference time clock 152 and that distributes the reference time clock via a dedicated cabling 156 (shown in dashed lines) to the server computers 102A-102D. The reference time clock 152 can be a highly reliable and auditable microsecond range UTC time source that delivers a pulse over the timing network 150 at predetermined time intervals, such as one pulse per second (pulse per second (PPS)) 158. The server computers 102A-102D can receive the time signal from the dedicated timing network 150 via the independent cabling 156 and use the time signal within a clock synchronization firmware 160 to synchronize a system clock 170 on the server computer. The synchronized system clock 170 can then be used by the instances 106A-106D on the server computers 102A-102D. In this way, each of the server computers 102A-102D operates on the same timing. Although a separate dedicated timing network 150 is shown, the timing information can be integrated into the local area network 130.

Figure 2:
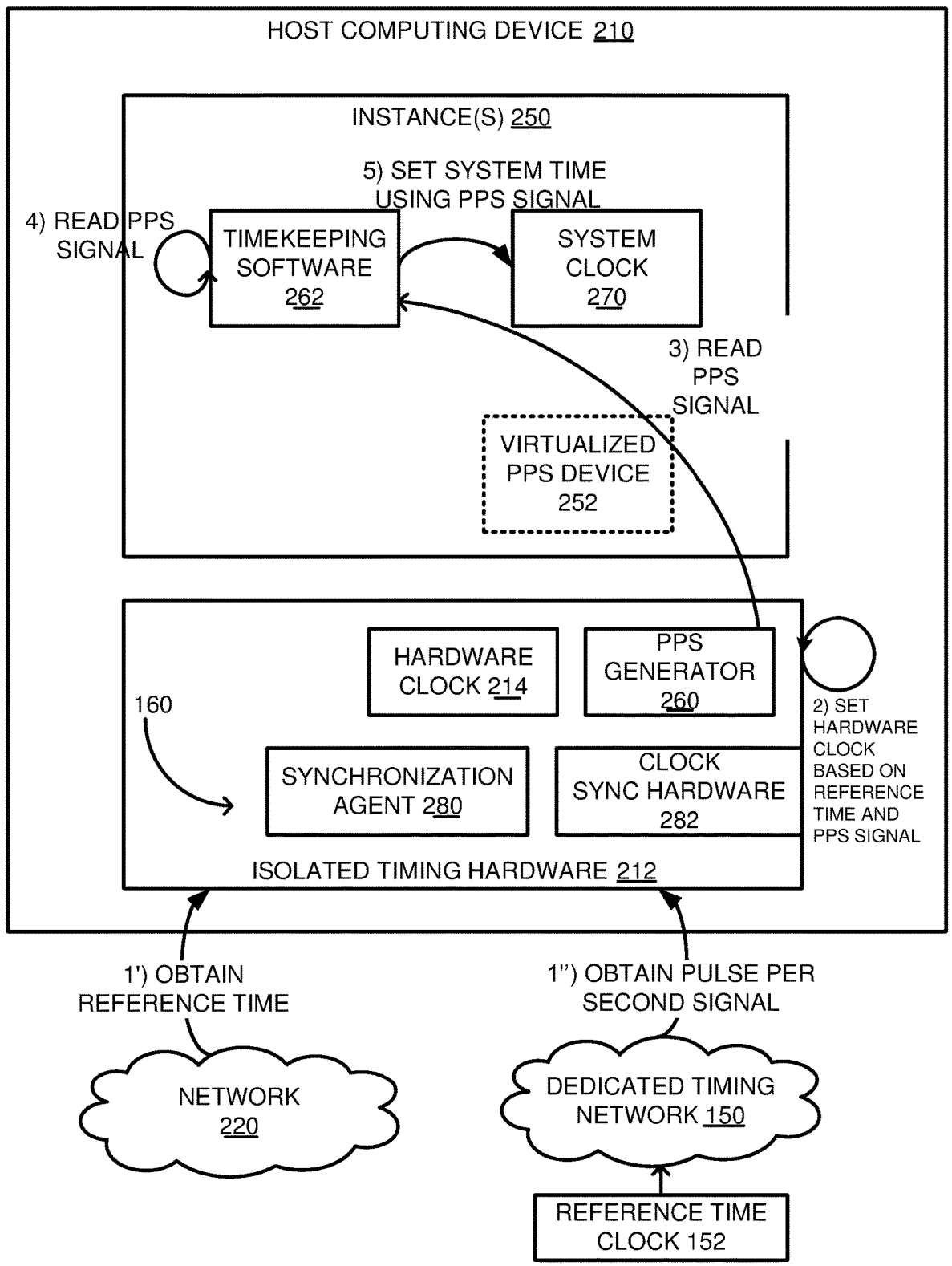
FIG. 2 is an example system for synchronizing timing hardware of a server computer using the dedicated timing network of FIG. 1.

FIG. 2 shows a host computing device 210, such as a server computer, that includes isolated timing hardware 212, with a hardware clock 214. The hardware clock 214 is first synchronized to a reference time clock 152. At (1'), the isolated timing hardware 212 receives a reference time from the network 130. The reference time is obtained based on a request transmitted to a remote device via a network-based time protocol, such as NTP. For example, a reference timekeeper may act as an NTP server via the network 220. The reference time may indicate a current time, such as the current date, hour, minute, second, etc. For example, the reference time may be provided as a coordinated universal time (UTC) value, a Unix time value, or the like. At (1"), a PPS signal is received from a dedicated time network 150 coupled to the reference time clock 152. The PPS signal may lack a reference point, and instead indicate an alignment of seconds (analogous to the "ticking" of an analog clock). For example, the PPS may be generated by a top-of-rack switch based on a signal from the reference time clock 152 as passed through a dedicated time network 150. However, the PPS signal may be highly accurate relative to the reference time. As such, the PPS signal may be combined with the reference time to determine a present time. Accordingly, at (2), the isolated timing hardware 212 sets a time of the hardware clock 214 based on the reference time and PPS signal. Such setting of the time is controlled by the clock synchronization firmware 160, which can include a synchronization agent 280 and clock synchronization hardware 282. The synchronization agent 280 can include software executing on a processor, while the clock synchronization hardware 282 is used by the synchronization agent 280 to ensure that the hardware clock 214 is accurately synchronized to the reference time clock 152.

At (3), an instance 250 can be provided with a virtualized PPS device 252 addressable as a local device to the instance 250. The virtualized PPS device 252 can act as a virtualized representation of a PPS generator 260, which provides an aligned signal to timekeeping software 262, such as in the form of a processor interrupt. Accordingly, the PPS generator 260 sends the signal at (3), which is read by the timekeeping software 262 at (4) and used to set a system clock 270 at (5). Setting the system time using the PPS signal is similar to setting the hardware clock 214 based on the reference time and the PPS signal.

Figure 3:
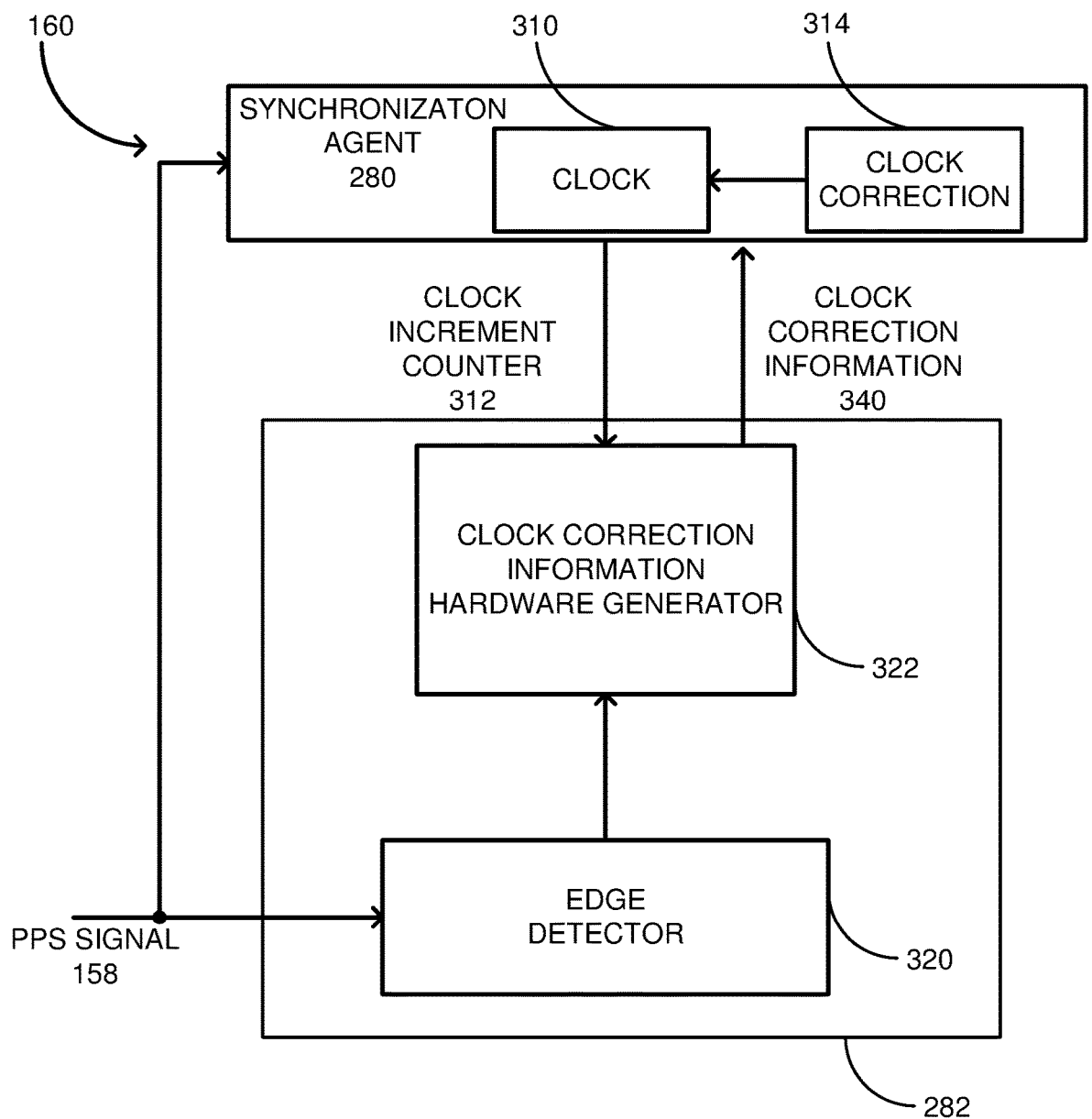
FIG. 3 shows example hardware according to one embodiment for synchronizing a system clock of a server computer with a Pulse Per Second (PPS) signal from the timing network.
Figure 4:
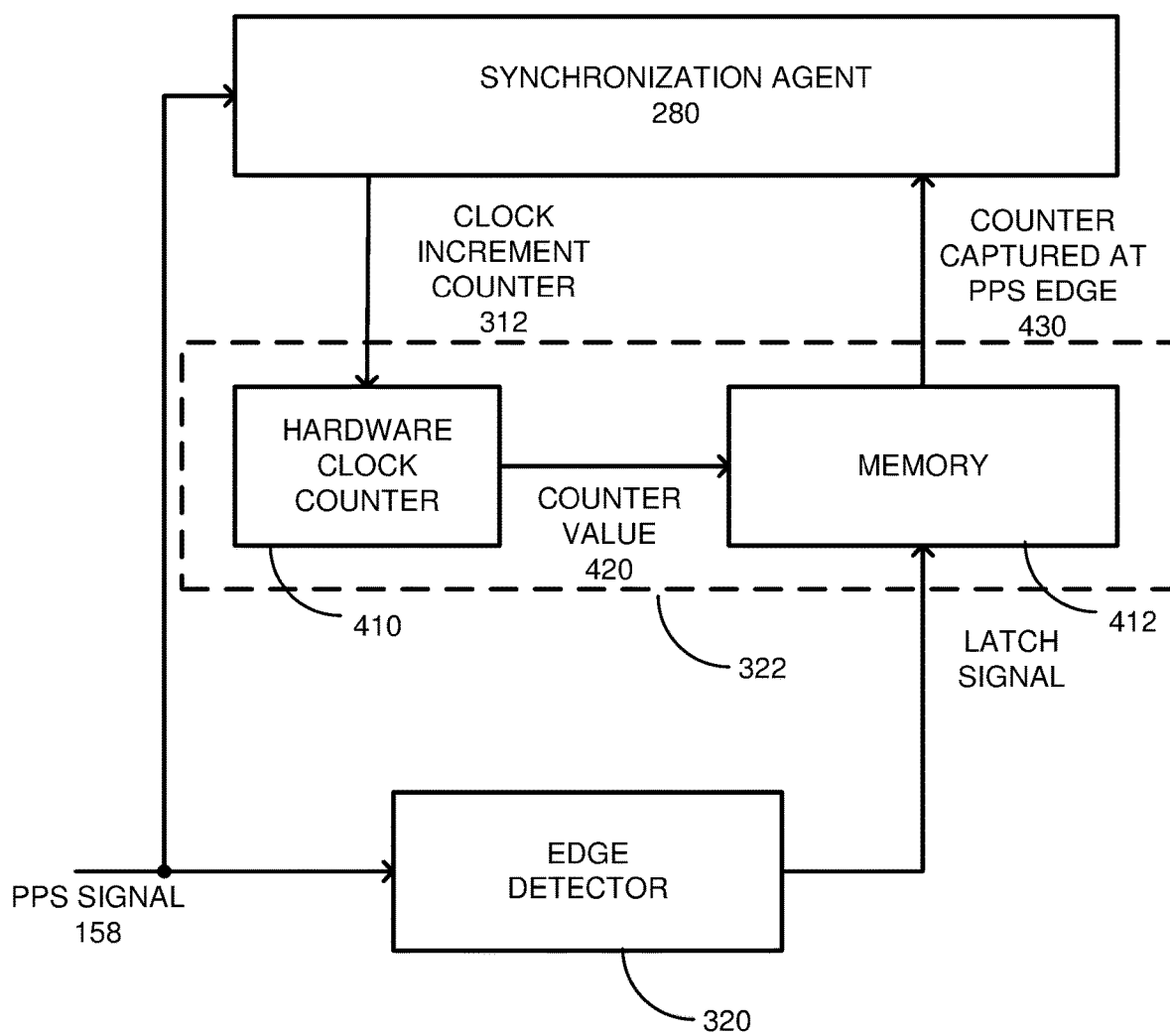
FIG. 4 shows further details, according to one embodiment, of the hardware of FIG. 3.
Figure 5:
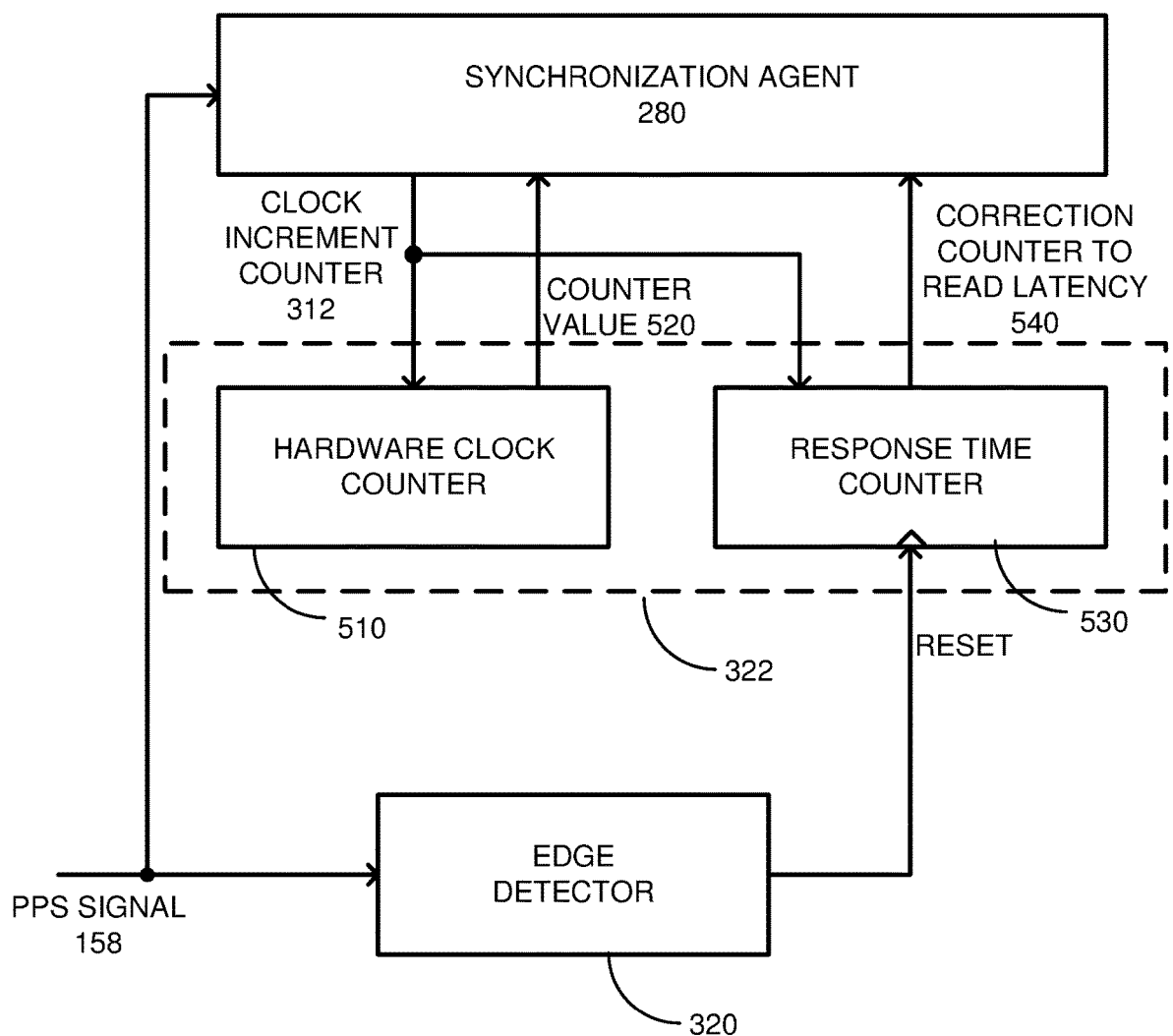
FIG. 5 shows further details, according to another embodiment, of the hardware of FIG. 3.

FIG. 3 is a diagram of an embodiment showing further details of the synchronization agent 280 and the clock synchronization hardware 282. The synchronization agent 280, which can be implemented in hardware or in a combination of hardware and software, includes a clock 310 that supplies a stream of pulses 312 to the clock synchronization hardware 282, which can be an integrated circuit (IC). Additionally, the synchronization agent 280 can implement a clock correction algorithm 314 that modifies the clock 310 so that a fixed number of clock pulses occur within a time duration controlled by the PPS signal 158. The clock synchronization hardware 282 includes an edge detector 320 and a clock correction information hardware generator 322 that captures a number of the clock increment counter pulses 312 that occurred between PPS pulses. The synchronization agent 280 also receives the PPS signal 158, which causes an interrupt to occur and an interrupt routine to execute. Because of the inherent latency of interrupt routines, the clock synchronization hardware 282 captures the state of clock correction information hardware generator 322 and provides the state to the synchronization agent 280 in the form of clock correction information 340 (which can include counter data described in FIGS. 4 and 5). The clock correction information 340 can be used by the clock correction algorithm 314 to modify the clock 310 so that a predefined number of clock pulses 312 occur between PPS pulses. In one simple example, one hundred clock pulses 312 can occur between each PPS pulse. If one hundred clock pulses do not occur, then the clock correction algorithm 314 can adjust the clock 310 to obtain one hundred pulses by lengthening or shortening a period of the pulses or by adding or subtracting pulses. The clock correction information hardware generator 322 includes hardware correction circuitry to capture a state of the counter in response to reading the PPS signal, and different versions of the hardware correction circuitry are illustrated in FIGS. 4 and 5. In one aspect, the hardware 322 captures the hardware cock counter based upon the PPS signal 158 and independent of the synchronization agent.

FIG. 4 shows further details, according to one embodiment, of the hardware 322, which includes a hardware clock counter 410. The hardware clock counter 410 increments on every pulse of the clock increment counter 312. A memory 412, such as a plurality of flip flops, is coupled to the edge detector 320 and latches a counter value 420 upon detection of a rising edge or falling edge of the PPS signal 158. A captured counter value 430 can be output from the memory 412 and supplied to the synchronization agent 280. Thus, when the synchronization agent 280 receives an interrupt due to the PPS signal 158 being a pulse, the synchronization agent 280 can read the counter value 430 knowing that value was captured when the PPS signal edge occurred. Thus, any latency that occurs due to the interrupt routine of the synchronization agent 280 does not impact the counter value 420, which is captured in hardware. The synchronization agent 280 can then modify the clock increment counter 312, as discussed above, to have a predetermined number of pulses between every edge of the PPS signal 158. The synchronization agent can then use the synchronized clock in a PPS generator 260 (FIG. 2), or to set a system clock.

FIG. 5 shows further details, according to another embodiment, of the hardware 322 including a first counter, which is a hardware clock counter 510. In this case, the hardware clock counter 510 can be read directly by the synchronization agent 280, as shown at 520. The hardware clock counter 510 increments every cycle of the clock increment counter signal 312. Upon detecting the PPS signal 158, the synchronization agent 280 enters an interrupt subroutine to read the counter value 520. However, due to the latency in reading, the counter value 520 might not align with the PPS signal 158. Accordingly, a second counter 530 is included within the hardware 322. The second counter 530 is a response-time counter that is reset upon receiving a signal from the edge detector 320. The counter 530 increments every clock of the clock increment counter 312 and provides a value indicating when an edge of the PPS signal 158 occurred. The synchronization agent 280 can then read the counter value 520 and the correction counter 540. A difference between the two counters provides a time when the PPS signal 158 occurred, regardless of any latency of the reads performed by the synchronization agent 280. The difference calculation can be performed in hardware or software.

Figure 6:
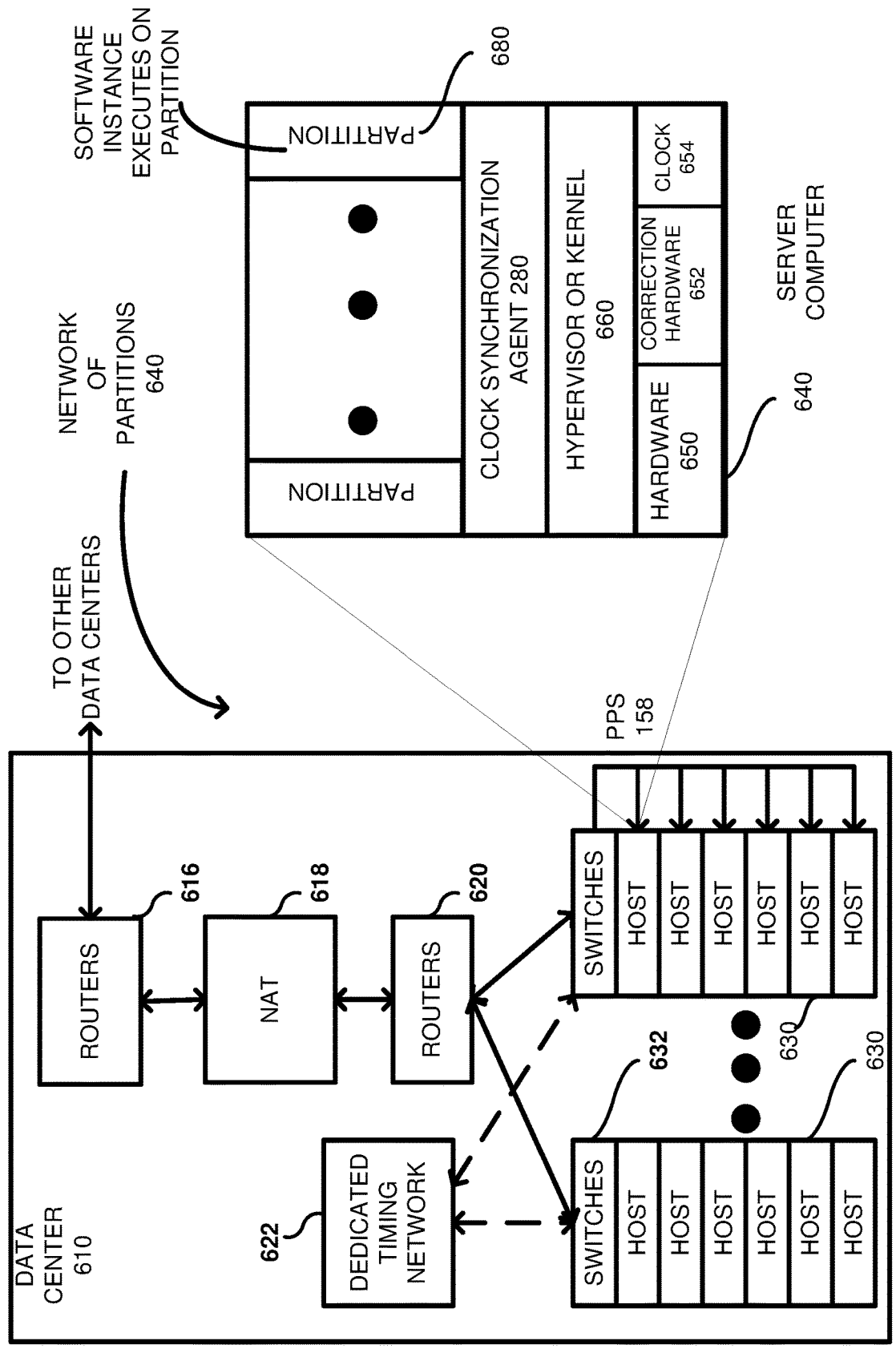
FIG. 6 shows an example of a plurality of host computers, routers and switches, which are hardware assets used for running virtual machine instances, wherein a host server computer includes a clock synchronization agent to adjust a system clock.

FIG. 6 illustrates a data center 610 and the physical hardware associated therewith. The data center 610 includes routers 616 that read address information in a received packet and determine the packet's destination. If the routers 616 decide that a different data center contains a host server computer, then the packet is forwarded to that data center. If the packet is addressed to a host in the data center 610, then it is passed to a network address translator (NAT) 618 that converts the packet's public IP address to a private IP address. The NAT also translates private addresses to public addresses that are bound outside of the datacenter 610. Additional routers 620 can be coupled to the NAT to route packets to one or more racks of host server computers 630. Each rack 630 can include a switch 632 coupled to multiple host server computers. A particular host server computer is shown in an expanded view at 640. The data center 610 also includes a dedicated timing network 622 coupled to the switches 632. The timing network 622 provides a PPS signal over separate cabling than is used for packet data. The switches 632 can, in turn, generate a PPS signal 158 transmitted to each host 630.

Each host 640 has underlying hardware 650 including one or more CPUs, memory, storage devices, etc. The hardware layer 650 can also include correction hardware 652 and a clock 654. The correction hardware 652 can include the memory 412 of FIG. 4 or the response time counter 530 of FIG. 5. Running a layer above the hardware 650 is a hypervisor or kernel layer 660. The hypervisor or kernel layer can be classified as a type 1 or type 2 hypervisor. A type 1 hypervisor runs directly on the host hardware 650 to control the hardware and to manage the guest operating systems. A type 2 hypervisor runs within a conventional operating system environment. Thus, in a type 2 environment, the hypervisor can be a distinct layer running above the operating system and the operating system interacts with the system hardware. Different types of hypervisors include Xen-based, Hyper-V, ESXi/ESX, Linux, etc., but other hypervisors can be used. A clock synchronization agent 280 can be part of the hypervisor or separated therefrom and generally executes on the hardware 650. The server computer 640 can execute one or more partitions 680, which are logical units of isolation by the hypervisor. Each partition 680 can be allocated its own portion of the hardware layer's memory, CPU allocation, storage, etc. Additionally, each partition can include a virtual machine and its own guest operating system. As such, each partition is an abstract portion of capacity designed to support its own virtual machine independent of the other partitions. As shown in FIG. 2, each partition can also have its own system clock.

Figure 7:
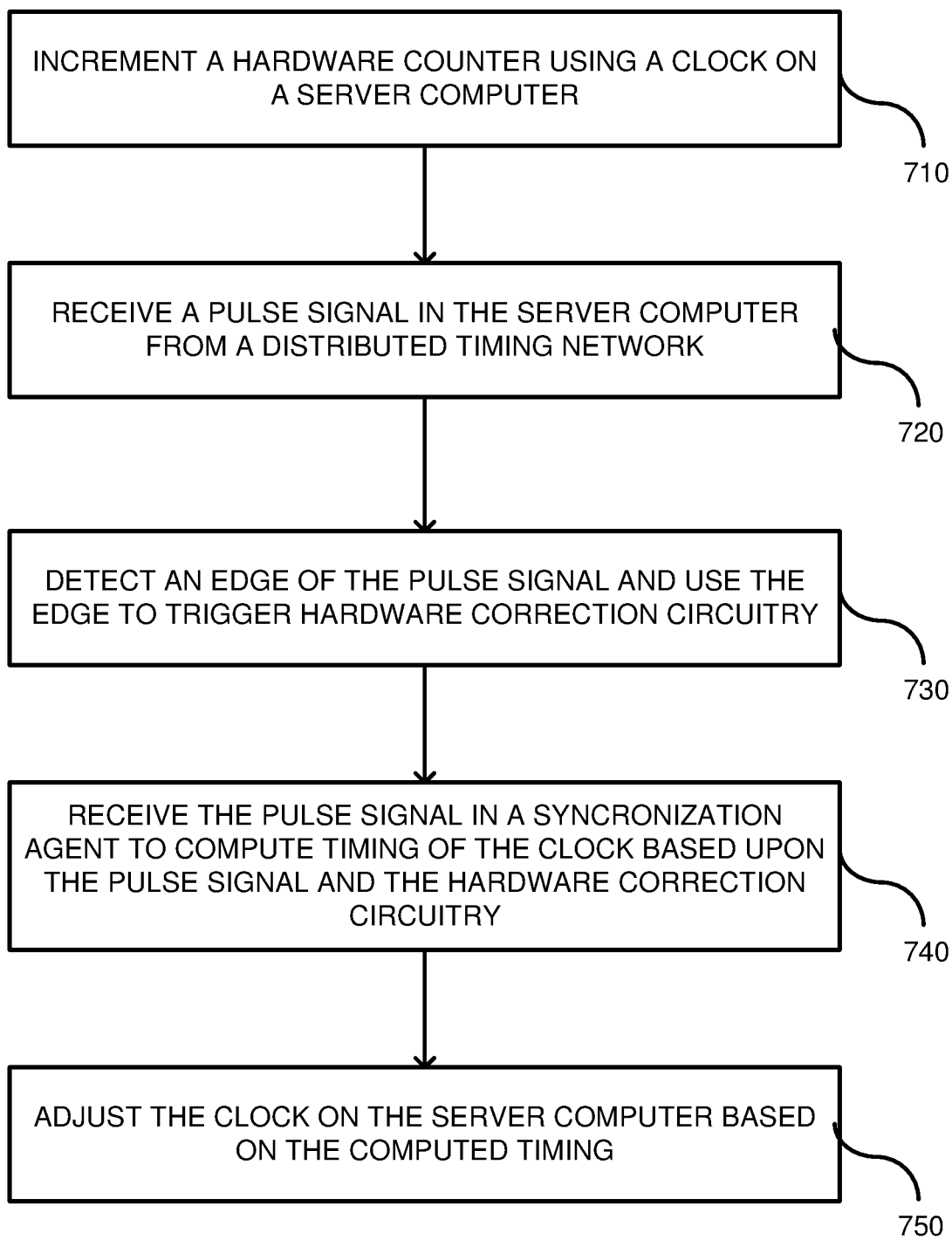
FIG. 7 is a flowchart according to one embodiment for adjusting a system clock in response to a pulse signal from a timing network.

FIG. 7 is a flowchart according to one embodiment for synchronizing a clock. In process block 710, a hardware counter is incremented using a clock on a server computer. For example, in FIG. 4, the clock correction information hardware generator 322 is incremented using the clock 310 (FIG. 3) associated with the synchronization agent 280. The clock 310 can be an output pin on a processor that the synchronization pulses at predetermined time intervals. In process block 720, a pulse signal is received in the server computer from a distributed timing network. For example, in FIG. 3, a PPS signal 158 is received by the clock synchronization hardware 282. In process block 730, an edge to the pulse signal can be detected and used to trigger hardware correction circuitry. For example, in FIG. 3, the edge detector 320 can detect an edge (rising or falling) of the PPS signal 158. Although not shown in FIG. 3, the edge can be used to trigger correction circuitry within the hardware 322 to generate the clock correction information 340. FIG. 4 shows that the trigger can be a latch signal to the memory 412, whereas FIG. 5 shows the trigger as a reset signal to the counter 530. In process block 740, the pulse signal is received in the synchronization agent to compute timing of the clock based upon the pulse signal and the hardware correction circuitry. For example, in FIG. 3, the synchronization agent 280 receives the PPS signal 158 and the clock correction information 340 and computes a clock correction using the clock correction module 314. In process block 750, the clock is adjusted based upon the computed timing. For example, in FIG. 3, the clock 310 can be adjusted to ensure that the clock increment counter 312 counts a predetermined number of times to align exactly to the period of the PPS signal. As shown in FIG. 2, the clock can then be used as part of the PPS generator 260 used to set the system clock 270.

Figure 8:
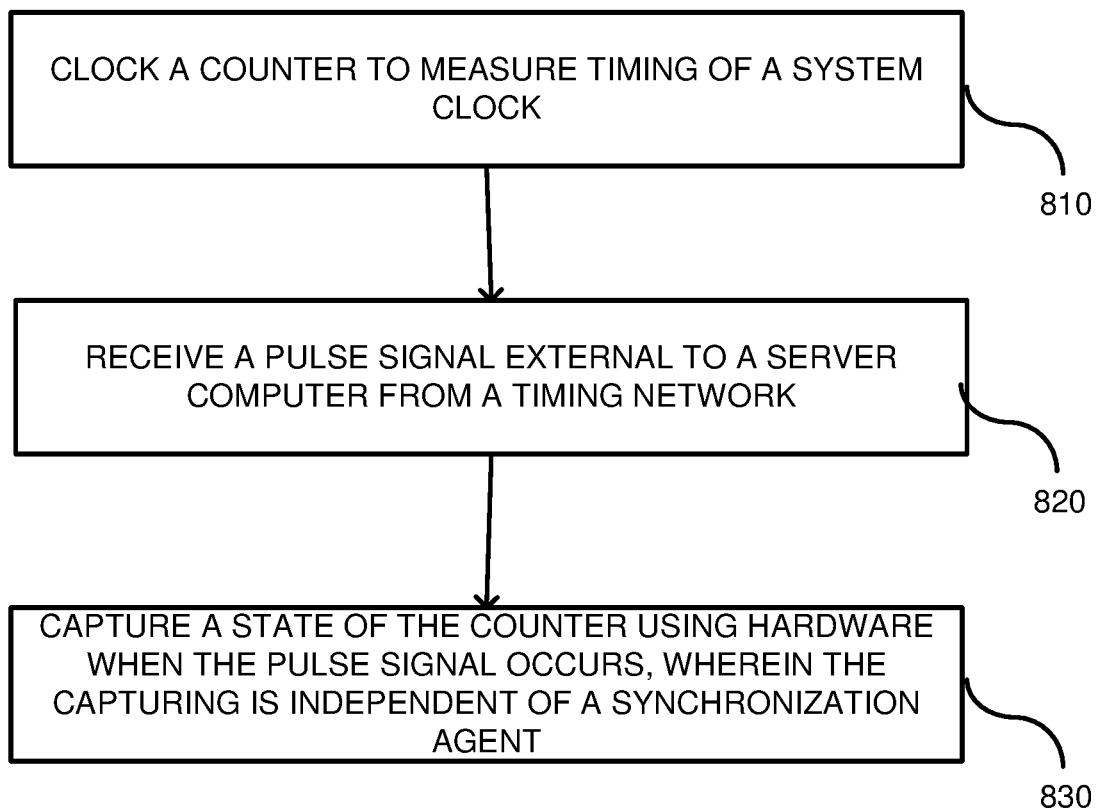
FIG. 8 is a flowchart according to another embodiment for adjusting a system clock in response to a pulse signal from a timing network.

FIG. 8 is a flowchart according to another embodiment for synchronizing a clock. In process block 810, a counter is clocked to measure timing of a system clock. For example, in FIG. 4, a hardware clock counter 410 is clocked by signal 312. Likewise, in FIG. 5, the hardware clock counter 510 is clocked by the signal 312. In process block 820, a pulse is received that is external to a server computer, wherein the pulse is received from a timing network. For example, in any of the FIGS. 1-5, the PPS signal 158 is received, such as from a timing network (see 150 FIGS. 1 and 2). In process block 830, a state of the counter is captured when the pulse signal is received, wherein the capturing is independent of the synchronization agent. For example, in FIG. 4, the state of the counter 410 is captured by the memory 412 using the edge detector 320. In FIG. 5, the response time counter 530 is used to capture the state of the counter 510 when the PPS signal is received.

Figure 9:
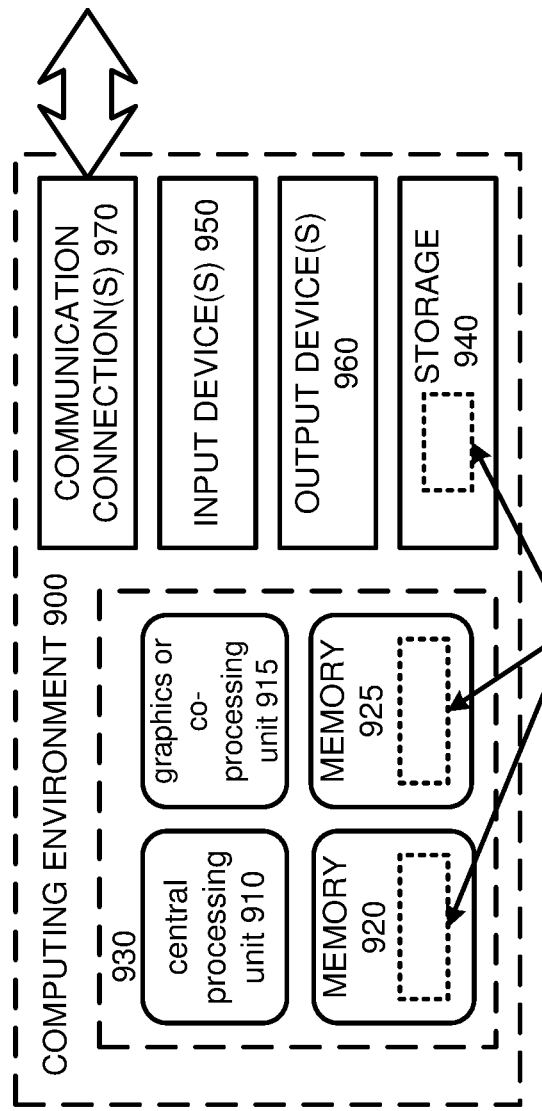
FIG. 9 depicts a generalized example of a suitable computing environment in which the described innovations may be implemented.

FIG. 9 depicts a generalized example of a suitable computing environment 900 in which the described innovations may be implemented. The computing environment 900 is not intended to suggest any limitation as to scope of use or functionality, as the innovations may be implemented in diverse general-purpose or special-purpose computing systems. For example, the computing environment 900 can be any of a variety of computing devices (e.g., desktop computer, laptop computer, server computer, tablet computer, etc.).

With reference to FIG. 9, the computing environment 900 includes one or more processing units 910, 915 and memory 920, 925. In FIG. 9, this basic configuration 930 is included within a dashed line. The processing units 910, 915 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 9 shows a central processing unit 910 as well as a graphics processing unit or co-processing unit 915. The tangible memory 920, 925 may be volatile memory (e.g., registers, cache, RAM), non-volatile memory (e.g., ROM, EEPROM, flash memory, etc.), or some combination of the two, accessible by the processing unit(s). The memory 920, 925 stores software 980 implementing one or more innovations described herein, in the form of computer-executable instructions suitable for execution by the processing unit(s).

A computing system may have additional features. For example, the computing environment 900 includes storage 940, one or more input devices 950, one or more output devices 960, and one or more communication connections 970. An interconnection mechanism (not shown) such as a bus, controller, or network interconnects the components of the computing environment 900. Typically, operating system software (not shown) provides an operating environment for other software executing in the computing environment 900, and coordinates activities of the components of the computing environment 900.

The tangible storage 940 may be removable or non-removable, and includes magnetic disks, magnetic tapes or cassettes, CD-ROMs, DVDs, or any other medium which can be used to store information in a non-transitory way and which can be accessed within the computing environment 900. The storage 940 stores instructions for the software 980 implementing one or more innovations described herein.

The input device(s) 950 may be a touch input device such as a keyboard, mouse, pen, or trackball, a voice input device, a scanning device, or another device that provides input to the computing environment 900. The output device(s) 960 may be a display, printer, speaker, CD-writer, or another device that provides output from the computing environment 900.

The communication connection(s) 970 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A method of synchronizing a clock on a server computer within a distributed timing network, the method comprising:
    incrementing a hardware counter using the clock on the server computer;
    receiving a pulse signal in the server computer from the distributed timing network, wherein the pulse signal is used to synchronize the clock on the server computer;
    detecting an edge of the pulse signal using an edge detector and using the edge to trigger hardware correction circuitry;
    receiving the pulse signal in a synchronization agent on the server computer, wherein, in response to the pulse signal, an interrupt routine on the synchronization agent reads the hardware correction circuitry and computes timing of the clock based upon the pulse signal and the hardware correction circuitry, wherein the pulse signal is received by the synchronization agent and directly received by the edge detector; and
    adjusting the clock on the server computer based upon the computed timing.

2. The method of claim 1, wherein the hardware correction circuitry includes a counter coupled to the synchronization agent and a memory coupled to the counter, wherein the memory captures a state of the counter upon detecting the edge of the pulse signal.

3. The method of claim 1, wherein the hardware correction circuitry includes a clock counter coupled to the synchronization agent and a response-time counter coupled to the synchronization agent that counts a number of clocks that occur after detecting the edge of the pulse signal.

4. The method of claim 3, wherein the synchronization agent subtracts a value of the response-time counter from a value of the clock counter to determine a number of clock cycles captured between pulses of the pulse signal.

5. The method of claim 3, wherein the response-time counter is reset upon detecting the edge of the pulse signal.

6. A method, comprising:
    clocking a counter to measure timing of a system clock within a server computer;
    receiving a pulse signal from a timing network external to the server computer, wherein the pulse signal is directly received by an edge detector; and
    capturing a state of the counter using hardware when the pulse signal occurs, wherein the capturing is independent of a synchronization agent used to adjust the system clock and wherein the synchronization agent receives the pulse signal in parallel with the edge detector and uses the captured state of the counter to adjust the system clock.

7. The method of claim 6, wherein the hardware used to capture the state of the counter includes a memory coupled to the counter that latches a value of the counter in response to the pulse signal.

8. The method of claim 7, wherein the value within the memory is used to adjust the system clock.

9. The method of claim 6, wherein the hardware used to capture the state of the counter includes a response time counter that increments in response to the pulse signal.

10. The method of claim 9, wherein the response time counter counts an amount of time after the pulse signal occurred.

11. The method of claim 10, wherein the synchronization agent computes when the pulse signal occurred by calculating a difference between the counter and the response time counter.

12. The method of claim 6, further including adjusting the system clock by the synchronization agent based upon the pulse signal.

13. The method of claim 6, wherein the timing network is independent of a communication network, which is used to exchange packet data.

14. The method of claim 6, wherein the pulse signal is transmitted to a plurality of server computers in a distributed network to synchronize timing between the server computers.

15. An integrated circuit (IC), comprising:
an edge detector for directly receiving a pulse signal;
a hardware clock counter for counting a number of clock cycles of a server computer;
hardware correction circuitry for delivering clock correction information; and
a synchronization agent configured to receive the clock correction information in response to the pulse signal;
wherein the hardware correction circuitry comprises a response time counter that is reset upon detecting an edge of the pulse signal;
wherein the synchronization agent is for subtracting the response time counter from the hardware clock counter to determine a number of counts that occur between pulses of the pulse signal;
wherein the synchronization agent performs the subtraction within an interrupt routine responsive to detection of the pulse signal or the subtraction is performed in hardware separate from the synchronization agent.

16. The IC of claim 15, wherein the hardware correction circuitry comprises a memory coupled to the hardware clock counter that latches a value of the hardware clock counter upon a detection of an edge of the pulse signal.

17. The IC of claim 15, wherein the IC is within a server computer coupled to a timing network, which delivers the pulse signal.

* * * * *